United States Patent [19]
Arques

[11] Patent Number: 4,768,211
[45] Date of Patent: Aug. 30, 1988

[54] SOLID STATE PHOTOSENSITIVE DEVICES
[75] Inventor: Marc Arques, Grenoble, France
[73] Assignee: Thomson-CSF, Paris, France
[21] Appl. No.: 51,213
[22] Filed: May 13, 1987

Related U.S. Application Data
[63] Continuation of Ser. No. 692,050, Jan. 16, 1985, abandoned.

[30] Foreign Application Priority Data
Jan. 20, 1984 [FR] France .................. 84 00887

[51] Int. Cl.$^4$ .............. G11C 19/28; H01L 29/78; H01L 27/14; H01L 31/00
[52] U.S. Cl. .................. 377/60; 307/311; 357/24; 357/30
[58] Field of Search ........... 357/24, 30; 377/57–63; 307/311

[56] References Cited
U.S. PATENT DOCUMENTS
4,093,872 6/1978 Hartman et al. ........ 357/24 LR
4,473,836 9/1984 Chamberlain ............ 357/30

FOREIGN PATENT DOCUMENTS
0060752 9/1982 European Pat. Off.
128828 12/1984 European Pat. Off. ...... 357/24 LR Primary Examiner—Gene M. Munson
Attorney, Agent, or Firm—Roland Plottel

[57] ABSTRACT

The present invention relates to an improvement to solid state photosensible devices of the type having a charge storing capacitor preceding the charge—voltage conversion stage. The photosensitive device of the invention comprises photosensitive detectors, each detector being connected to a charge integration cell, which is itself connected via a multiplexer to a charge—voltage conversion stage, preceded by a first storage capacitor connected to a resetting means with a supplementary storage capacitor located upstream of the first capacitor. The bias voltage of the supplementary capacitor can be brought to a high or a low level, as a function of the charge quantity to be integrated, for modifying the value of the capacitor receiving the charges.

11 Claims, 6 Drawing Sheets

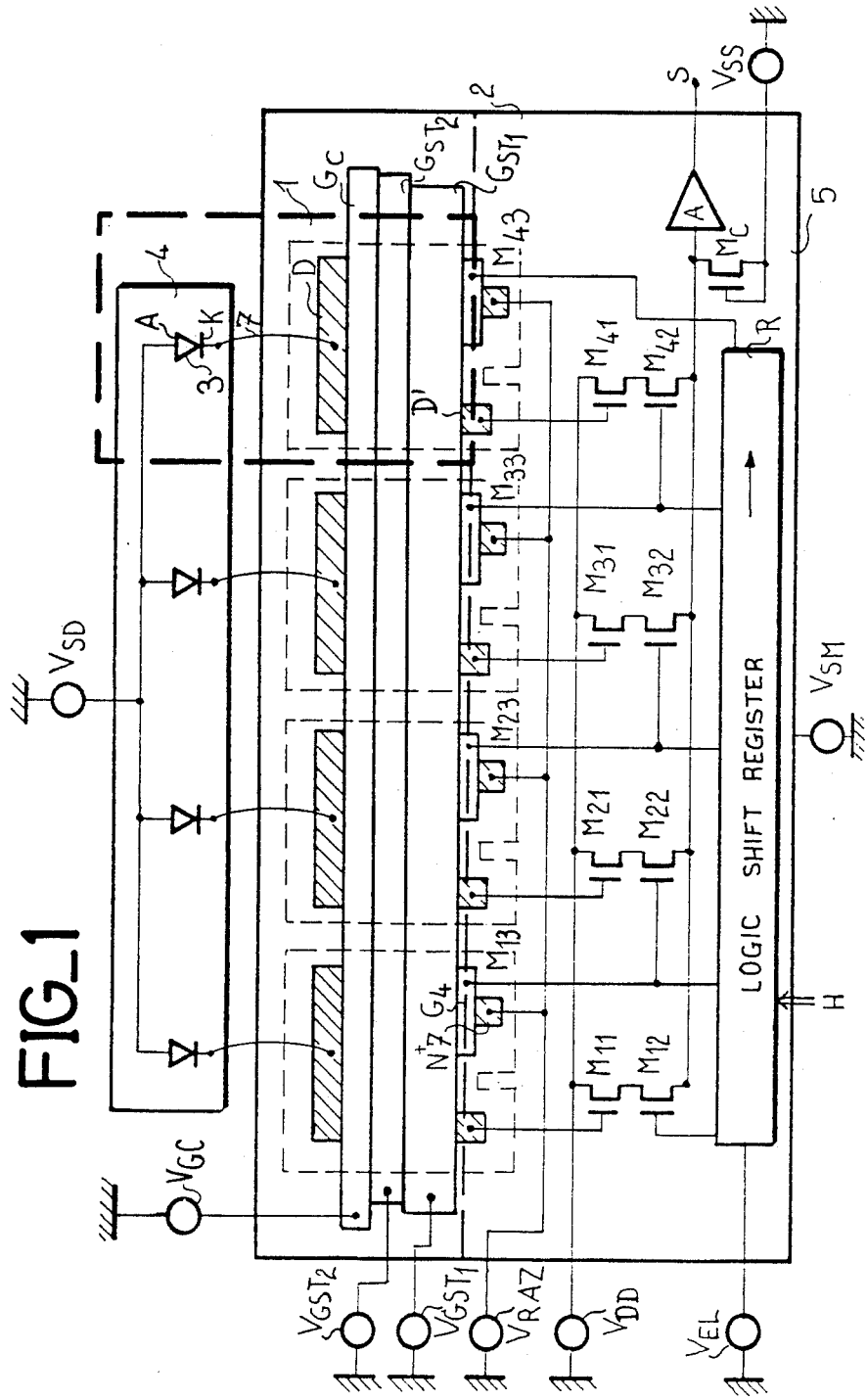
FIG_1

FIG_2
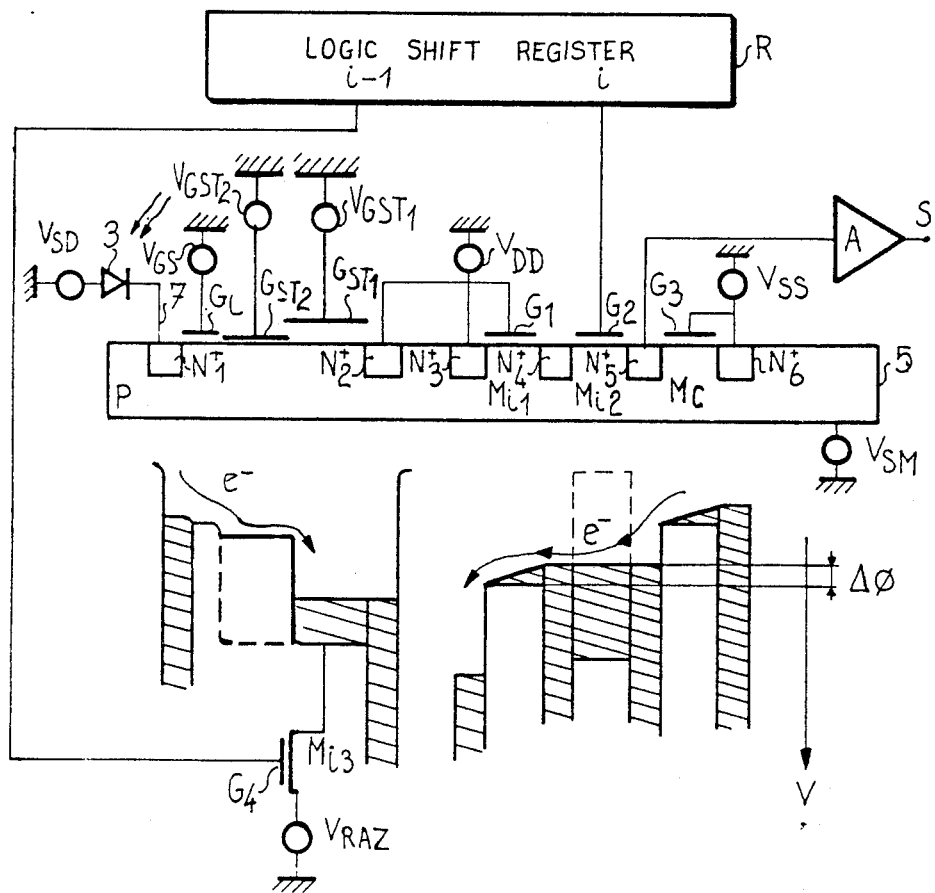

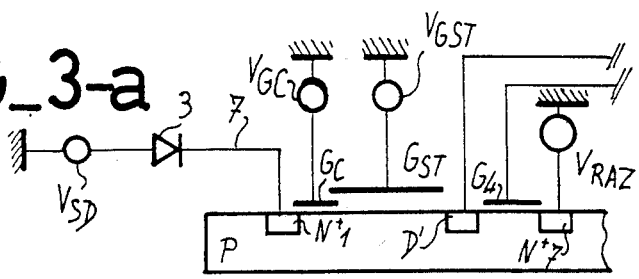
FIG_3-a
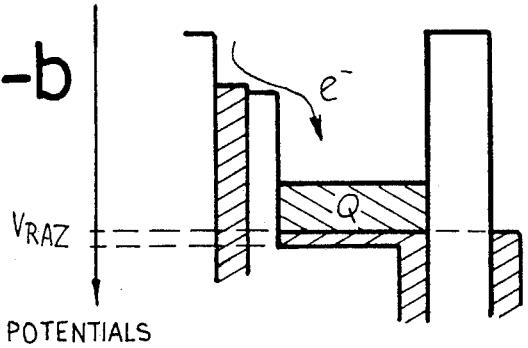
FIG_3-b
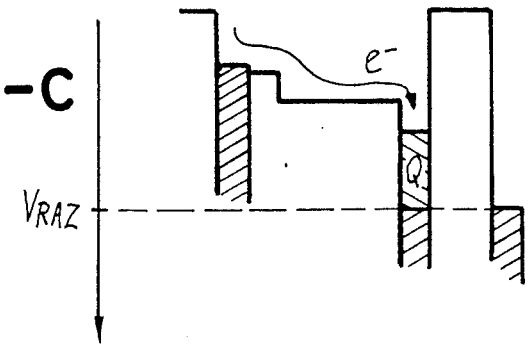
FIG_3-c
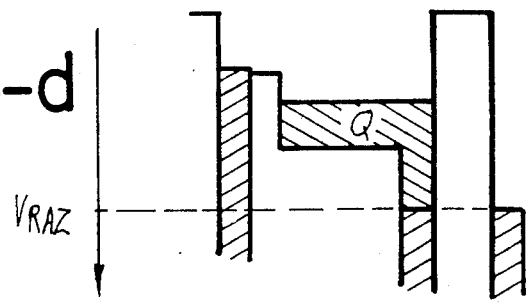
FIG_3-d

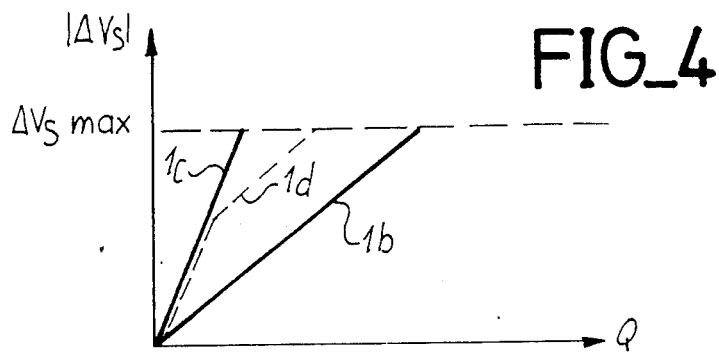
FIG_4
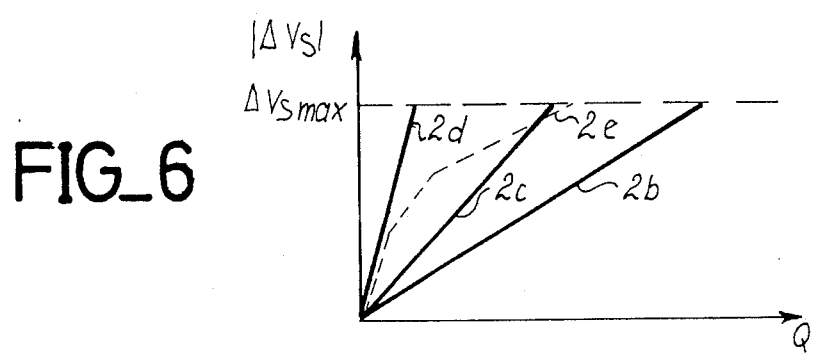
FIG_6
FIG_7-a    FIG_7-b    FIG_7-c
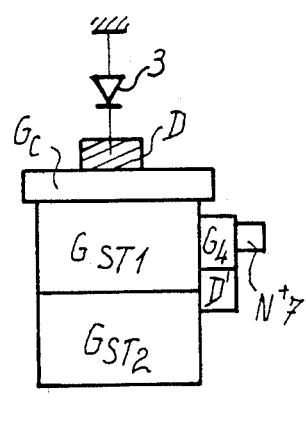 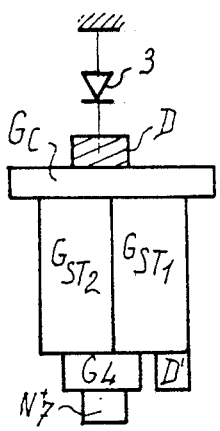 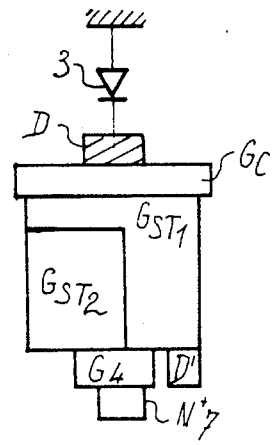

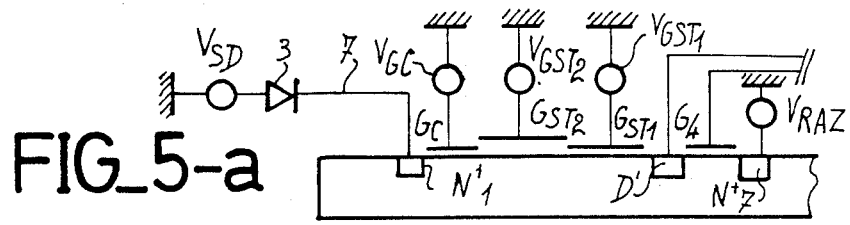
FIG_5-a
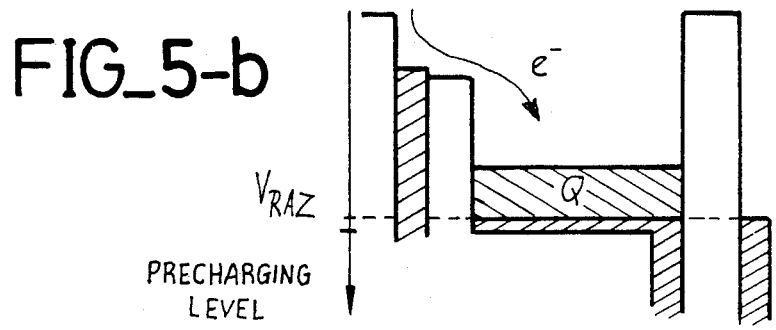
FIG_5-b
PRECHARGING LEVEL
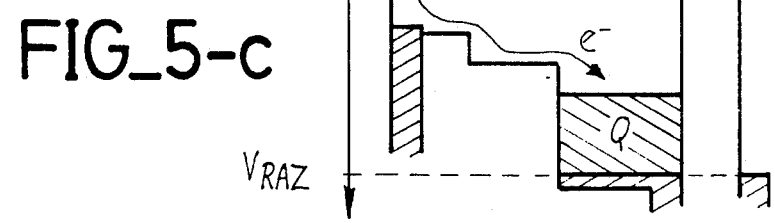
FIG_5-c
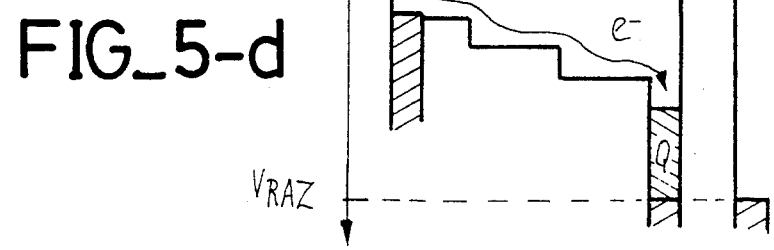
FIG_5-d
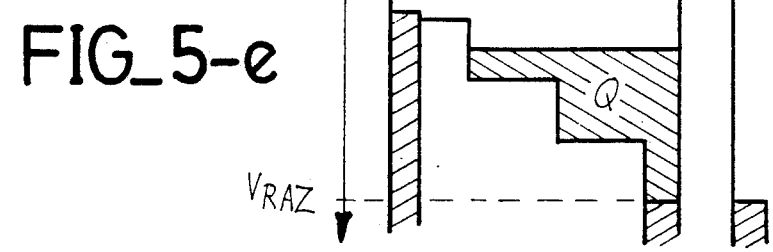
FIG_5-e

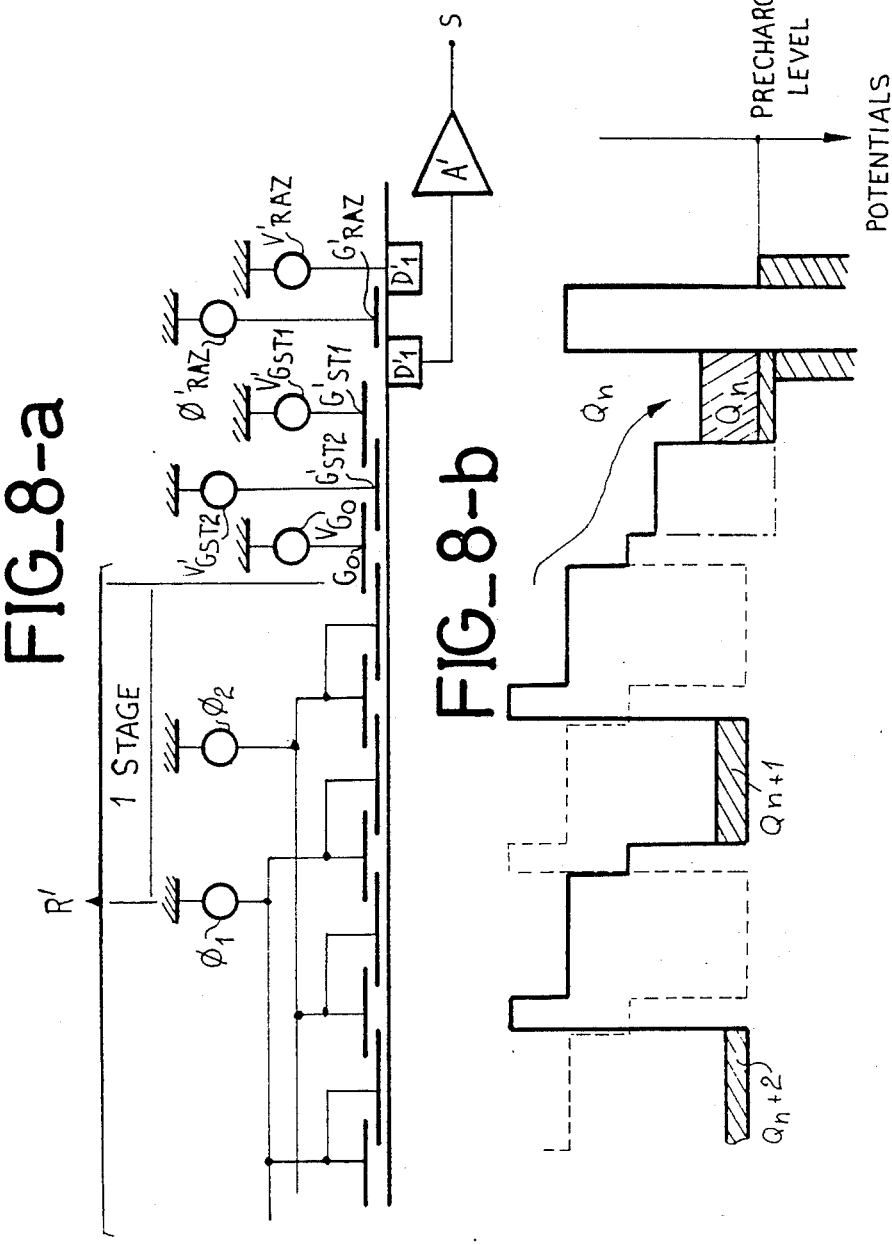

4,768,211

SOLID STATE PHOTOSENSITIVE DEVICES

This application is a continuation of application Ser. No. 692,050, filed 1-16-85, now abandoned.

FIELD OF THE INVENTION

The present invention relates to solid state photosensitive devices used both in the visible and infrared ranges.

DESCRIPTION OF THE PRIOR ART

Thus, the present invention more particularly relates to an improvement to solid state photosensitive devices decribed in French Patent Application No. 83 09827 in the name of THOMSON-CSF, namely to solid state photosensitive devices of the type comprising at least one detector connected to a charge integration zone, which is itself connected to a reading stage performing the charge—voltage conversion, constituted by voltage reading means, each of which is connected to an integration zone via a diode making it possible to read the potential corresponding to the charge quantity in the integration zone, by at least one addressing means for sequentially addressing the reading means and by resetting means for the previously read integration zone. However, the present invention can also apply to the reading stage of solid state photosensitive devices mainly constituted by detectors, each of which is connected to a charge integration zone and by a charge transfer shift register receiving in parallel the charges integrated in each charge integration zone and supplying them in series to a reading stage, performing the charge—voltage conversion.

In both of the aforementioned photosensitive device types, the charge quantity Q to be read by the reading stage or charge—voltage conversion stage is firstly stored in a capacitor C, where it gives a voltage variation $\Delta V = (Q/C)$. However, these devices are generally limited by a maximum value of the voltage variations $\Delta V_{max}$, which can be permitted by the circuit. However, the charge quantity which has to be integrated is sometimes difficult to forecast, either because the scene observed is constituted by a variable mean lighting, or the detectors to be associated with the reading device are of different types, particularly in the case of hybrid circuits especially used in the infrared. Therefore the capacitor must be dimensioned in accordance with the maximum charge which it may be necessary to store. Therefore $C = (Q_{max}/\Delta V_{max})$. Thus, the capacitor is overdimensioned in most cases of use of solid state photosensitive devices, where the charge Q is generally below $Q_{max}$. Thus, for the photosensitive device, this leads to a relatively low photon—output voltage variation conversion factor, so that the output gain is also relatively low. The present invention consequently aims at obviating the disadvantage by making it possible to select the value of capacitor C as a function of the lighting conditions and the nature of the detectors.

SUMMARY OF THE INVENTION

The present invention therefore relates to a solid state photosensitive device of the type comprising at least one photosensitive detector, each detector being connected to a charge integration cell, which is itself connected under control of a multiplexer to a charge—voltage conversion stage preceded by a first storage means connected to a resetting means, wherein it also comprises at least one supplementary charge storage means adjacent to the first storage means, said supplementary storage means being controlled by variable bias voltages making it possible to modify the capacitance of the storage means as desired to vary the quantity of integrated that can be stored.

BRIEF DESCRIPTION OF THE DRAWINGS

The invention is described in greater detail hereinafter relative to non-limitative embodiments and with reference to the attached drawings, wherein show:

FIG. 1 a plan view of a strip-type photosensitive device used more particularly in the infrared, whose charge integration cells have been modified in accordance with the first embodiment of the invention.

FIG. 2 a diagrammatic cross-sectional view of the device of FIG. 1 and the corresponding surface potentials in the substrate into which said device is integrated.

FIGS. 3a to 3d respectively, a diagrammatic cross-sectional view of another embodiment of the detection and integration part of a solid state photosensitive device according to the invention and the evolution of the corresponding surface potentials in the substrate as a function of the bias voltages applied to the storage means.

FIG. 4 a graph giving the evolution of the voltage as a function of the charges integrated by the photosensitive device of FIG. 3.

FIGS. 5a to 5e respectively, a diagrammatic sectional view of another embodiment of the present invention and the evolution of the corresponding surface potentials in the substrate as a function of the voltages applied to the various storage means.

FIG. 6 a graph giving the evolution of the voltage as a function of the integrated charges in the case of the device of FIG. 5.

FIGS. 7a to 7c plan view of the various modes for installing supplementary storage means according to the invention.

FIGS. 8a and 8b respectively a diagrammatic sectional view of an embodiment of the present invention in the case where the multiplexer is a shift register and the evolution of the corresponding surface potentials in the substrate as a function of the bias voltage applied.

In the various drawings, the same references designate the same elements, but for reasons of clarity, the dimensions and proportions thereof have not been respected.

DESCRIPTION OF THE PREFERRED EMBODIMENTS

FIG. 1 shows a photosensitive device more particularly used in the infrared range. In per se known manner, the photosensitive device is constituted by charge integration and photon detection cells 1 and a reading stage 2, which gives an electric image analysis signal at the output. For example, FIG. 1 shows a device having four cells. However, it is obvious that the device according to the invention can have a larger number of cells. Moreover, FIG. 1 relates to a strip-type photosensitive device, but the invention can also apply to a matrix-type device, such as that described in French Patent Application No. 83 09827 in the same of the Applicant.

In the infrared range and as shown in FIG. 1, each cell 1 has a photosensitive detector 3 integrated on to a semiconductor substrate 4 differing from substrate 5 into which are integrated the other elements of the photosensitive device and an integration zone formed on substrate 5. Substrate 4 is preferably made from mercury and cadmium telluride, lead and tin telluride or indium antimonide. In the same way, the substrate 5 is preferably made from P type silicon, but it could also be made from N type silicon in the case of common cathode detection diodes, gallium arsenide or any other equivalent semiconductor material.

For example and as shown in FIGS. 1 and 2, photosensitive detector 3 used in the present invention is a photodiode. However, it is obvious to the Expert that the invention applies to whatever type of detector is used.

Thus, as shown in FIGS. 1 and 2, anode A of photodiode 3 receives a bias voltage $V_{SD}$. Cathode K is connected by a connection 7 to the charge integration zone making it possible to integrate into substrate 5 the charges produced in photodiode 3 by the radiation to be detected and symbolized by the wavy arrows in FIG. 2.

Moreover, each charge integration zone on the semiconductor substrate 5 which is biased at a voltage $V_{SM}$, comprises a diode D constituted by a N type zone formed in the P type silicon semiconductor substrate 5. This zone is designated by the reference $N_1^+$ in FIG. 2. Each diode is connected by a connection 7 to cathode K of the corresponding photodiode. Furthermore, according to the invention, an electrode or gate $G_C$ connected to the bias voltage $V_{GC}$ separates each diode D from a first charge storage capacitor constituted by a gate $G_{ST2}$, an insulating layer and a substrate. This first charge storage capacitor is followed by a second charge storage capacitor also formed by a gate $G_{ST1}$, an insulating layer and a substrate. The storage capacitor symbolized by gates $G_{ST2}$ and $G_{ST1}$ are biased, in the manner to be described hereinafter, by two different bias voltages $V_{GST2}$ and $V_{GST1}$.

In the same way, and as shown in FIGS. 1 and 2, the reading stage 2 comprises four voltage reading means or charge—voltage conversion stages constituted by MOS transistors $M_{I1}$, which are connected in follower. The gate $G_1$ of each MOS transistor $M_{I1}$ is connected to a reading diode D' adjacent to the storage capacitor $G_{ST1}$ of each charge integration and detection cell 1. Diode D' is connected by a N type diffusion designated by reference $N_2^+$ in FIG. 2. The drain of the MOS transistor $M_{I1}$ formed by the N type diffusion designated $N_3^+$ in FIG. 2 is connected to a bias voltage $V_{DD}$. Moreover, the source of the MOS transistors $M_{I1}$ is connected via MOS transistors $M_{I2}$ acting as switches, to a charge transistor $M_C$. The latter is constituted by a depletion mode MOS transistor, whose gate $G_3$ is connected to the source formed by the N type diffusion designated $N_6^+$ in FIG. 2, said source being biased by a d.c. voltage $V_{SS}$. Furthermore, each gate $G_2$ of the MOS switching transistors $M_{I2}$ is connected to one of the outputs of a logic shift register R with a series input and parallel outputs. Shift register R makes it possible to address and make conductive one of the MOS transistors $M_{I2}$ as a consequence of performing the multiplexing of the different sequential stages.

The reading stage 2 also comprises resetting means, which are formed by MOS transistors $M_{I3}$, whose gate $G_4$ is connected to the output of the logic shift register R corresponding to the next sequential stage. The induced source of the MOS transistors $M_{I3}$ is constituted by the corresponding storage capacitor $G_{ST1}$ and the drain formed by a N type diffusion designated $N_Z^+$ is connected to a d.c. voltage $V_{RAZ}$. In the represented embodiment, use is made of the same logic shift register R for controlling the switching MOS transistors $M_{I2}$ and the resetting MOS transistors $M_{I3}$, which requires one more stage than the number of cells or the use of a looped shift register.

A description will now be given of the operation of the aforementioned device with particular reference to the lower part of FIG. 2. The latter shows the surface potential in substrate 5 during the reading of a stage, when a low value charge Q has been stored beneath the storage gate $G_{ST1}$, the storage gate $G_{ST2}$ not being used.

Thus, the left-hand part shows the potential beneath the integration zone of a cell 1, which is realized in per se known manner by diode D, gate $G_C$ and the two storage capacitors $G_{ST1}$ and $G_{ST2}$. This zone forms an MOS transistor, whose diode D is the source and whose storage capacitor $G_{ST1}$ in the represented embodiment, namely in the case of weak illumination, is the induced drain. Thus, in this case, the bias voltage $V_{GST2}$ is brought to a low level and gate $G_{ST2}$ acts as a passage gate for the electrons.

Thus, the input MOS transistor is polarized under saturation conditions, because the voltage $V_{GST1}$ applied to gate $G_{ST1}$ exceeds voltages $V_{GC}$ and $V_{GST2}$ applied to gates GC and $G_{ST2}$. The level of the charges on diode D is aligned with the potential close to the constant potential beneath gate $G_C$. The anode A of the photodiode is biased by the d.c. voltage $V_{SD}$ which is e.g. chosen as being equal to zero volt.

The charges produced in the detector by the electromagnetic radiation are stored in the capacitor produced beneath the storage gate $G_{ST1}$ and polarized by $V_{GST1}$, as is symbolically shown in FIG. 2, where the hached areas indicate the presence of minority carriers with respect to substrate 5.

The charges produced in the detector are firstly stored beneath the storage grid $G_{ST1}$. However, according to the present invention, if the charge to be stored exceeds the storage capacitance $G_{ST1}$, the bias voltage $V_{GST2}$ is when $V_{GST2}$ is switched to high level to be equal to $V_{GST1}$ switched to high level, so that e.g. $V_{GST2}$ to equal to $V_{GST1}$, which then makes it possible to store the charges under $G_{ST2}$ instead of solely under $G_{ST1}$, as is shown by the broken line in FIG. 2.

With regards to the reading of the charges integrated in the integration zone, this is carried out in per se known manner when the corresponding output i of the shift register R is at logic level 1, so that the gate of MOS transistor $M_{I2}$ receives a high voltage so as to make said transistor conductive, all the gates of the other MOS transistors acting as a switch and receiving a logic level 0 so as to block the transistors. In this case, the MOS transistors $M_{I2}$ behaves in the manner of a resistor, the MOS transistors $M_C$, namely the load, being connected to the follower transistor $M_{I1}$, so that a conventional follower stage is obtained, the bias voltage $V_{DD}$ being made much higher than the bias voltage $V_{SS}$, as shown in FIG. 2.

The diffusion $N_2^+$ to the right of the storage gate $G_{ST1}$ and connected to gate $G_1$ of MOS transistor $M_{11}$ makes it possible to obtain at the gate a potential representing the potential beneath the storage gate $G_{ST1}$ in the represented embodiment.

In addition, the potential at diffusion $N_5^+$ is aligned with the potential at diffusion $N_4^+$, because transistor $M_{I2}$ is equivalent to a resistor. However, the potential at diffusion $N_4^+$ is a function of the potential beneath gate $G_1$, because in a sequential stage the potential difference $\Delta\phi$ is a constant. Thus, at diffusion $N_5^+$ a voltage is obtained, which is representative of the voltage of the storage gate $G_{ST1}$. This voltage is supplied across an amplifier A to the output terminal S of the photosensitive device. After reading the information on input I, the logic level 1 of shift register R is shifted by one stage under the action of clock H. This is followed by the reading of input i+1.

The logic level 1 is then applied to gate $G_4$ of the resetting MOS transistor $M_{I3}$, which is made conductive. The charges beneath the storage gate $G_{S+1}$ are then discharged from the voltage source or supply $V_{St1}$ are then discharged from the voltage source or supply $V_{RAZ}$, which can be chosen equal to the voltage $V_{DD}$. Thus, the value of the storage capacitance of the input i during the reading of input i+1 is reinitialized. Thus, during the resetting of the storage capacitance, the charges supplied by the photodiode are directly removed to the voltage source $V_{RAZ}$ and are consequently not used.

Thus, according to the invention, during the integration of charges, use is made of the capacitance produced beneath gate $G_{ST1}$, when the charge quantity to be integrated is small, or if said quantity is large the voltage $V_{GST2}$ is switched to a high level and the charges are then stored both beneath gate $G_{ST1}$ and beneath gate $G_{ST2}$. In order to be able to subsequently read the charges and reset the integration cell 1, it is necessary, according to the invention, for the first capacitor $G_{ST1}$ to be adjacent to the reading diode D' and to the gate $G_4$ of the resetting MOS transistor $M_{I3}$ as shown in FIGS. 1 and 2. Voltage $V_{GST2}$ can be identical to or lower than voltage $V_{GST1}$.

FIG. 3a shows another embodiment of the integraton cell of a solid state photosensitive device, whose other parts are identical to the photosensitive devices of FIGS. 1 and 2.

In the embodiment of FIG. 3a, a single storage gate $V_{GST2}$ is provided at the integration cell, as shown therein, gate $G_{ST}$ is adjacent to the reading diode D' formed by the N type diffusion designated $N_2+$, which is itself adjacent to the gate $G_4$ followed by the diffusion $N_7+$, the assembly representing the resetting transistor $M_{I3}$.

With this configuration, the different storage means for the charges supplied by the photodiodes 3 are constituted by the diode D' connected to the gate $G_1$ of MOS transistor $M_{I3}$ and by the storage gate $G_{ST}$ biased by the voltage $V_{GST}$, which can be raised to a high or low level, as a function of the charge quantity to be integrated. Thus, diode D' can be used as a storage capacitor because, through being adjacent to gate $G_4$, the electrons stored on diode D' and on gate $G_1$ can be discharged via gate $G_4$ to the resetting voltage $V_{RAZ}$, without passing beneath the storage gate $G_{ST2}$.

With reference to FIGS. 3b to 3d, the different operating possibilities of the embodiment of FIG. 3a will show be shown.

When the charge Q to be stored is high, the bias voltage $V_{GST}$ is at a high level higher than the resetting voltage $V_{RAZ}$, which forms the precharging level shown in FIG. 3b. In this case, the operation is identical to that described with reference to FIGS. 1 and 2, and the electrons supplied by photodiodes 3 are stored both beneath gate $G_{ST2}$, in diode D' and on gate $G_1$. $C_{ST}$ is the MOS capacitance beneath $G_{ST}$ and $C_O$ is the sum of the capacitance of diode D' and on gate $C_1$, so that the total storage capacity $C_{STT}$ is in this case $C_{STT} = C_{ST} + C_O$.

When the charge Q to be stored is particularly small, the bias voltage $V_{GST}$ is then reduced to a value close to $V_{GC}$, in such a way that, in the absence of any charge, the potential beneath $G_{ST}$ is close but very slightly above that beneath $G_C$, as shown in FIG. 3c. In this case, the electrons supplied by the photodiodes 3 pass beneath the gate $G_{ST}$ and are stored in diode D' and on gate $G_1$. In this case, the total storage capacity $C_{STT}$ is $C_{STT} = C_O$.

As shown in FIG. 3d, it is possible to envisage an intermediate case, in which the bias voltage $V_{GST}$ is brought to an intermediate level between the resetting voltage $V_{RAZ}$ and the bias voltage of gate $V_{GC}$. In this case, the electrons supplied by photodiodes 3 are first stored beneath diode D' and gate $G_1$, and then beneath the storage gate $G_{ST}$.

FIG. 4 shows the variation of the output voltage of the system as a function of the integrated charge Q. Line 1b corresponding to the case of FIG. 3b has a slope proportional to $$\frac{1}{C_O + C_{ST}},$$

and line 1c corresponding to the case of FIG. 3c has a slope proportional to $(1/C_O)$. Moreover, curve 1d corresponds to the case of FIG. 3d, in which the bias voltage $G_{ST}$ is an intermediate voltage between the two preceding values. When the charge Q to be stored is small, it is only stored beneath $C_O$ and the slope of curve 1d is in the case proportional to $(1/C_O)$, but when charge Q is larger it is stored in parallel on $C_O$ and $C_{ST}$ and the slope of curve 1d is in this case proportional to $$\frac{1}{C_O + C_{ST}}.$$

On examining the different curves of FIG. 4, it can be seen that in the case where the charge to be integrated is small, it is preferable to operate with a smaller storage capacity $C_O$, so as to obtain larger voltage variations at the output, namely a higher output gain.

A description will now be given with reference to FIGS. 5a to 5e of a third embodiment of the integration cell of a photosensitive device of the type according to FIGS. 1 and 2. In this case, gate $G_{ST}$ has been replaced by two gates $G_{ST1}$ and $G_{ST2}$ forming MOS capacitors $C_{ST1}$ and $C_{ST2}$ biased by two different bias voltages $V_{GST1}$ and $V_{GST2}$.

A description will now be given of the various operating possibilities for this integration cell with reference to FIGS. 5b to 5e.

In the case of a large charge Q to be integrated, the bias voltages $V_{GST2}$ and $V_{GST1}$ are both brought to an identical high level exceeding the resetting voltage $V_{RAZ}$, as shown in FIG. 5b. In this case, the total storage capacity $C_{TT}$ is equal to:

$$C_{TT} = C_O + C_{ST1} + C_{ST2}$$

in which $C_O$ corresponds to the capacitance of diode D' and of gate $G_1$, $C_{ST1}$ to the capacitance beneath gate $G_{ST1}$ and $C_{ST2}$ to the capacitance beneath gate $G_{ST2}$.

In the case where the charge Q is smaller, the bias voltage $V_{GST2}$ can be brought to a low level slightly higher than the bias voltage level of gate $G_C$, as shown in FIG. 5c. In this case, the total charge storage capacity is equal to:

$$C_{TT} = C_O + C_{ST1}$$

In the case where the charge quantity to be stored Q is very low, it is possible as in the embodiment of FIG. 3a to only store charges in diode D' and on gate $G_1$, as shown in FIG. 5d. In this case the total storage capacity $C_{TT}$ is equal to:

$$C_{TT} = C_O.$$

As in the embodiment of FIG. 3a, it is possible to bias $V_{GST2}$ and $V_{GST1}$ at different voltages, so that $V_{GST1}$ is lower than $V_{RAZ}$ and $V_{GST2}$ is lower than $V_{GST1}$, but higher than $V_{GC}$, as shown in FIG. 5e. In this case, charges Q are firstly integrated into diode D and on gate $G_1$ and then beneath gate $G_{ST1}$, finally being passed beneath gate $G_{ST2}$.

The curves giving the output voltage variation as a function of charge Q corresponding to FIGS. 5b to 5c are shown in FIG. 6. In this case, line 2b has a slope proportional to $$\frac{1}{C_O + C_{ST1} + C_{ST2}},$$

line 2c a slope proportional to $$\frac{1}{C_O + C_{ST1}}$$

and line 2d a slope proportional to ($1/C_O$). Moreover, curve 2e is constituted by three lines respectively having a slope proportional to ($1/C_O$), then proportional to $$\frac{1}{C_O + C_{ST1}}$$

and finally proportional to $$\frac{1}{C_O + C_{ST1} + C_{ST2}}.$$

In FIGS. 7a to 7c are shown various possible arrangements for gates $G_{ST1}$ and $G_{ST2}$. One of the constraints imposed during the choice of the arrangement of gates $G_{ST1}$ and $G_{ST2}$ is that the reading diode D' and the gate $G_4$ of the resetting MOS transistor $M_{f3}$ must be adjacent to the first storage gate which it is wished to use. This gate is designated $G_{ST1}$ in the embodiments of FIGS. 7a to 7c, the other adjacence conditions are optional. However, as shown in FIG. 7a, the diode D' can be positioned astride $G_{ST1}$ and $G_{ST2}$ and $G_4$ is only adjacent to $G_{ST1}$, or, as shown in FIG. 7b and 7c, diode D' may only be adjacent to gate $G_{ST1}$ and gate $G_4$, positioned astride $G_{ST1}$ and $G_{ST2}$. Moreover, in the case of FIGS. 7a to 7c, the electrons from the detector are not obliged to pass beneath the supplementary storage capacitor $G_{ST2}$ and then gate $G_{ST1}$ is adjacent to the control gate $G_C$ between the reading diode D of the photodetector and the first storage capacitor $G_{ST1}$.

It is obvious that various other arrangements for gates $GS_{T1}$ and $G_{ST2}$ can be envisaged, without passing beyond the scope of the invention.

A description will now be given with reference to FIGS. 8a and 8b, of an embodiment of the present invention used in a photosensitive device, in which multiplexing is carried out in per se known manner with the aid of a charge transfer shift register R'. In this case, the charge integration and detection cells, which are not shown, are identical to the embodiment of FIG. 1, with the exception of the fact that they only have a single level of storage means. In this case, each storage means is connected to one stage of shift register R, which transfers the integrated charges by acting on the control phases $\phi_1$ and $\phi_2$ towards a charge—voltage conversion stage.

As shown in FIG. 8a, the charge—voltage conversion stage, which is separated from register R' by a passage gate $G_O$, e.g. connected to a fixed voltage $V_{GO}$, is constituted by a first storage means $G'_{ST1}$ connected to a bias voltage raised to a high level $V'_{GST1}$. This storage means is adjacent to a reading diode $D'_1$ connected to an amplifier A' and to a resetting transistor constituted by the gate $G'_{RAZ}$ connected to a voltage $\phi'RAZ$, which can be brought to a high level or a low level for precharging the reading diode and by the diode $D'_1$ biased by the voltage $V'_{RAZ}$.

According to the invention, a supplementary charge storage means constituted by capacitor $G'_{ST2}$ is provided between gate $G_O$ and capacitor $G'_{ST1}$. Capacitor $G'_{ST2}$ is connected to a bias voltage $V'_{GST2}$ which can be brought to a high or a low level, as a function of the quantity of charges to be read, as shown by the broken line in FIG. 8b. The operation of these two storage means $G'_{ST1}$ and $G'_{ST2}$ is identical to that of the storage means $G_{ST1}$ and $G_{ST2}$ in FIG. 1. In this embodiment, the use of supplementary storage means does not take it possible to reduce the dimensions of the integration and storage cells, as well as the shift register, which must be dimensioned so a to integrate the maximum charge, but it does make it possible to increase the gain of the output signal.

It is obvious to the worker in the art that the photosensitive device of FIG. 8a can be modified in numerous ways without passing beyond the scope of the invention. Thus, register R' can have 3 or 4 control phases. Gate $G_O$ can be connected to a fixed voltage as shown in FIG. 8a, or to the phase $\phi_1$.

Moreover, in the two above embodiments, use has been made of one or two supplementary storage means. However, it is obvious that a larger number of storage means can be used without passing beyond the scope of the invention.

Furthermore, with regards to the control of the bias voltages $V_{GST}$ or $V_{GST2}$, said voltages can either be positioned at the start of use as a function of the application or the type of photodetector used, or a servocontrol can be considered. In this case, the servocontrol takes account of the output voltage, compares it with two upper and lower reference voltages and as a function of the result of these comparisons switches the bias voltage of the supplementary storage means from a low level to a high level or vice versa, as explained hereinbefore.

The invention has been described with reference to a solid state photosensitive device, but it can obviously apply to all types of solid state devices in which the charge—voltage conversion stage is preceded by a storage capacitor, so as to increase the gain at the output. However, when the present invention is used in solid state photosensitive devices having as the multiplexer a charge transfer register, the invention can only be used at the reading stage and does not make it possible to reduce the dimensions of the shift register, which in all cases must be able to transfer the maximum admissible charge.

What is claimed is:

1. A solid state photosensitive device of the kind including a plurality of photodetectors means for reading and storing the charge generated by each photodetector, said means being connected to the photodetector and including first and second storage means for storing charge, the first storage means being controlled by a potential with fixed level while the second storage means comprises a storage electrode controlled by a potential with variable high and low levels for varying its storing capacity.

means connected to the storage means for resetting to zero the storage means, and means for converting into voltage a quantity of charge, said means being connected to the storage means for converting the charge stated therein, and multiplexing means for switching on sequentially one of the means for converting into voltage a quantity of charge.

2. A device according to claim 1, in which the first storage means is an MOS diode also included in the means for coverting into voltage a quantity of charge, and the second storage means is an MOS capacitor.

3. A device acording to claim 1, in which the first and second storage means are each MOS capacitors.

4. A device according to claim 1 in which the multiplexing means is a logic shift register with serial input and parallel outputs each connected to a means for converting into voltage a quantity of charge, said register receiving on its input a clock signal and delivering sequentially on each output a high level voltage.

5. A device according to claim 4, in which each parallel output of the logic shift register is also connected to a means for resetting to zero the storage means to reset the previously read storage means.

6. A device according to claim 5, in which the first storage means is constituted by an MOS diode also included in the means for converting into voltage a quantity of charge, and the second storage means is an MOS capacitor.

7. A device according to claim 5, in which the first and second storage means are MOS capacitors.

8. A solid state photosensitive device of the kind including:

at least one photodetector, means for reading and storing the charge generated by the photodetector, said means being connected to a photodetector, a charge transfer snift register with parallel inputs each connected to the means for reading and storing the charge and a serial output, a first and second storage means connected to the serial output, the first storage means being controlled by a potential with fixed levels while the second storage means is controlled by a potential with variable high and low levels for varying the storage capacity, means for resetting to zero the storage means, said means being connected to the storage means, and means for converting into voltage a quantity of charge, said means being connected to the first storage means.

9. A solid state photosensitive device of the kind including

N photodetectors where N is plural

N means for reading and storing the charge generated by the photodetectors, each means being connected to a separate photodetector of the plurality and including a first storage means and a supplemental storage means for storing charge, the first storage means being controlled by a potential with a fixed level and the supplemental storage means comprises a storage electrode controlled by a potential with variable high and low levels for varying its storing capacity N resetting means, each connected to a separate first storage means for resetting to zero such storage means N means for converting into voltage a quantity of charge, each means being connected to a separate first storage means for converting the charge stored therein, and a logic shift register with a single input receiving a clock signal and with (N+1) outputs, the n th output being connected to the n th means for converting into voltage a quantity of charge and to the (n−1) th resetting means.

10. A device according to claim 9, in which each of the first storage means is an MOS diode that is also included in the means for converting into voltage quantity of charge, and each of the supplemental storage means is an MOS capacitor.

11. A device according to claim 9, in which each of the first and supplemental storage means are MOS capacitors.

* * * * *